(12) United States Patent
Won et al.

(10) Patent No.: US 10,881,029 B2
(45) Date of Patent: Dec. 29, 2020

(54) POWER RELAY ASSEMBLY

(71) Applicant: AMOGREENTECH CO., LTD., Gimpo-si (KR)

(72) Inventors: Min Ho Won, Incheon (KR); Seung Jae Hwang, Incheon (KR)

(73) Assignee: AMOGREENTECH CO., LTD.

( * ) Notice: Subject to any disclaimer, the term of this patent is extended or adjusted under 35 U.S.C. 154(b) by 0 days.

(21) Appl. No.: 16/608,055

(22) PCT Filed: Jun. 11, 2018

(86) PCT No.: PCT/KR2018/006566
§ 371 (c)(1),
(2) Date: Oct. 24, 2019

(87) PCT Pub. No.: WO2019/017593
PCT Pub. Date: Jan. 24, 2019

(65) Prior Publication Data
US 2020/0196486 A1     Jun. 18, 2020

(30) Foreign Application Priority Data

Jul. 20, 2017 (KR) .................. 10-2017-0092102
Jun. 8, 2018 (KR) .................. 10-2018-0066367

(51) Int. Cl.
*H05K 7/06* (2006.01)
*H05K 7/20* (2006.01)
(Continued)

(52) U.S. Cl.
CPC .......... *H05K 7/20509* (2013.01); *B60L 50/64* (2019.02); *H05K 7/06* (2013.01);
(Continued)

(58) Field of Classification Search
CPC ....................................................... H05K 7/06
See application file for complete search history.

(56) References Cited

U.S. PATENT DOCUMENTS

| 4,439,815 A * | 3/1984 | Close ................... H05K 1/0263 |
| | | 361/720 |
| 2015/0047876 A1 * | 2/2015 | De Laeter ................ C25D 5/12 |
| | | 174/119 R |

(Continued)

FOREIGN PATENT DOCUMENTS

| JP | 2011-216802 | 10/2011 |
| KR | 10-2011-0001013 | 1/2011 |

(Continued)

OTHER PUBLICATIONS

International Search Report for PCT/KR2018/006566 dated Sep. 21, 2018.

*Primary Examiner* — Hung V Ngo
(74) *Attorney, Agent, or Firm* — K&L Gates LLP

(57) ABSTRACT

Provided is a power relay assembly. A power relay assembly according to an exemplary embodiment of the present invention comprises: a support plate equipped with at least one electrical element on one surface thereof and comprising a plastic material having heat dissipation and insulation properties; and at least one bus bar which comprises a contact part which is electrically connected to the electrical element and directly contacts one surface of the support plate, wherein the contact part of the bus bar is fixed to one surface of the support plate.

14 Claims, 11 Drawing Sheets

(51) Int. Cl.
*B60L 50/64* (2019.01)
*B60L 15/20* (2006.01)

(52) U.S. Cl.
CPC ..... *H05K 7/20436* (2013.01); *H05K 7/20854* (2013.01); *B60L 15/20* (2013.01)

(56) References Cited

U.S. PATENT DOCUMENTS

2018/0109040 A1* 4/2018 Iizuka ................ H01R 13/6485
2019/0208658 A1* 7/2019 Ikeda ....................... H05K 5/06

FOREIGN PATENT DOCUMENTS

| KR | 10-2011-0078990 | 7/2011 |
| KR | 10-1278229 | 6/2013 |
| KR | 10-2014-0095320 | 8/2014 |

* cited by examiner

POWER RELAY ASSEMBLY

CROSS-REFERENCE TO RELATED APPLICATIONS

This application is a national phase application which claims priority to and the benefit of PCT/KR2018/006566 filed on Jun. 11, 2018, which claims priority to Korean Patent Application No. 10-2017-0092102 filed on Jul. 20, 2017, and also claims priority to Korean Patent Application No. 10-2018-0066367 filed on Jun. 8, 2018, all of which are hereby incorporated by reference in their entireties.

FIELD OF THE DISCLOSURE

The present invention relates to a power relay assembly, and more specifically, to a power relay assembly that can be used in, for example, an electric vehicle.

BACKGROUND

An electric vehicle is a generic term for vehicles driven using electricity. Generally, electric vehicles are classified into electric vehicles (EV) driven by only electricity, hybrid electric vehicles (HEV) using electricity and fossil fuel, and the like.

In an electric vehicle, a power relay assembly is located between a high-voltage battery and a motor. The above-described power relay assembly serves to selectively supply power of the high-voltage battery.

That is, the power relay assembly includes a main relay, a pre-charge relay, a pre-charge resistor, and the like, and the above-described components are electrically connected to each other through a bus bar.

The main relay supplies or blocks the power between the high-voltage battery and the motor, and the pre-charge relay and the pre-charge resistor prevent damage to an apparatus due to an initial current.

Further, the bus bar is a conductor having low impedance and large current capacity, and can individually connect at least two circuits or can connect several equivalent points in one system.

Generally, the power relay assembly is installed in a trunk or a cabin room in order to be connected to the high-voltage battery installed in the trunk. Accordingly, the heat dissipation performance of the main relay or the pre-charge relay should be secured to prevent performance degradation and damage due to heat.

SUMMARY

The present invention is directed to providing a power relay assembly capable of securing heat dissipation performance.

Further, the present invention is directed to providing a power relay assembly in which a support plate includes a plate-like metal member to be capable of reinforcing strength and implementing an electromagnetic wave shielding effect.

One aspect of the present invention provides a power relay assembly including: a support plate having at least one electrical element mounted on one surface thereof and including a plastic material having a heat dissipation property and an insulation property; and at least one bus bar electrically connected to the electrical element, and including a contact part directly in surface contact with one surface of the support plate, wherein the contact part of the bus bar is fixed to the one surface of the support plate.

Further, the contact part may be in surface contact with a portion of the support plate formed of a plastic material having a heat dissipation property and an insulation property.

As an example, the support plate may include an accommodation groove recessed inward in a region corresponding to the contact part, and the contact part may be disposed to be inserted into the accommodation groove. In this case, the accommodation groove may be formed to have a depth the same as a thickness of the contact part, and any one of an adhesive member and a heat transferring material may be interposed between a bottom surface of the accommodation groove and the contact part.

Alternatively, the contact part may be fixed to the one surface of the support plate through a fixing member. In this case, the fixing member may be any one of a clip member, a pin member, and a bolt member.

Further, the support plate may further include a plate-like metal member disposed to be spaced an interval apart from the contact part. In this case, the metal member may be buried inside the support plate, or may be fixed to the one surface of the support plate so that one surface thereof is exposed to the outside. In this case, the metal member may be disposed on the support plate to be spaced 1 mm or more apart from the contact part.

Further, a fine groove configured to improve a bonding force with the support plate may be formed in a surface of the metal member.

In addition, a coating layer having an insulation property and a heat dissipation property may be formed on an exposed surface of the power relay assembly.

In addition, the bus bar may be formed of a conductive metal material. As an example, the bus bar may be formed of an aluminum material, and may have a coating layer having an insulation property and a heat dissipation property on a surface thereof.

Further, the above-described power relay assembly may include at least one cover to prevent exposure of the bus bar to the outside, wherein at least a part of the cover may be formed of a plastic material having a heat dissipation property and an insulation property.

According to the present invention, a support plate configured to fix a bus bar can have a heat dissipation property. Accordingly, since heat generated from the bus bar can be quickly dispersed through the support plate, performance degradation and damage of components due to the heat can be prevented.

Further, in the present invention, since the support plate can shield electromagnetic waves, the influence between the components due to noise can be prevented, and a malfunction due to the electromagnetic waves can be prevented beforehand.

DETAILED DESCRIPTION

Figure 1:
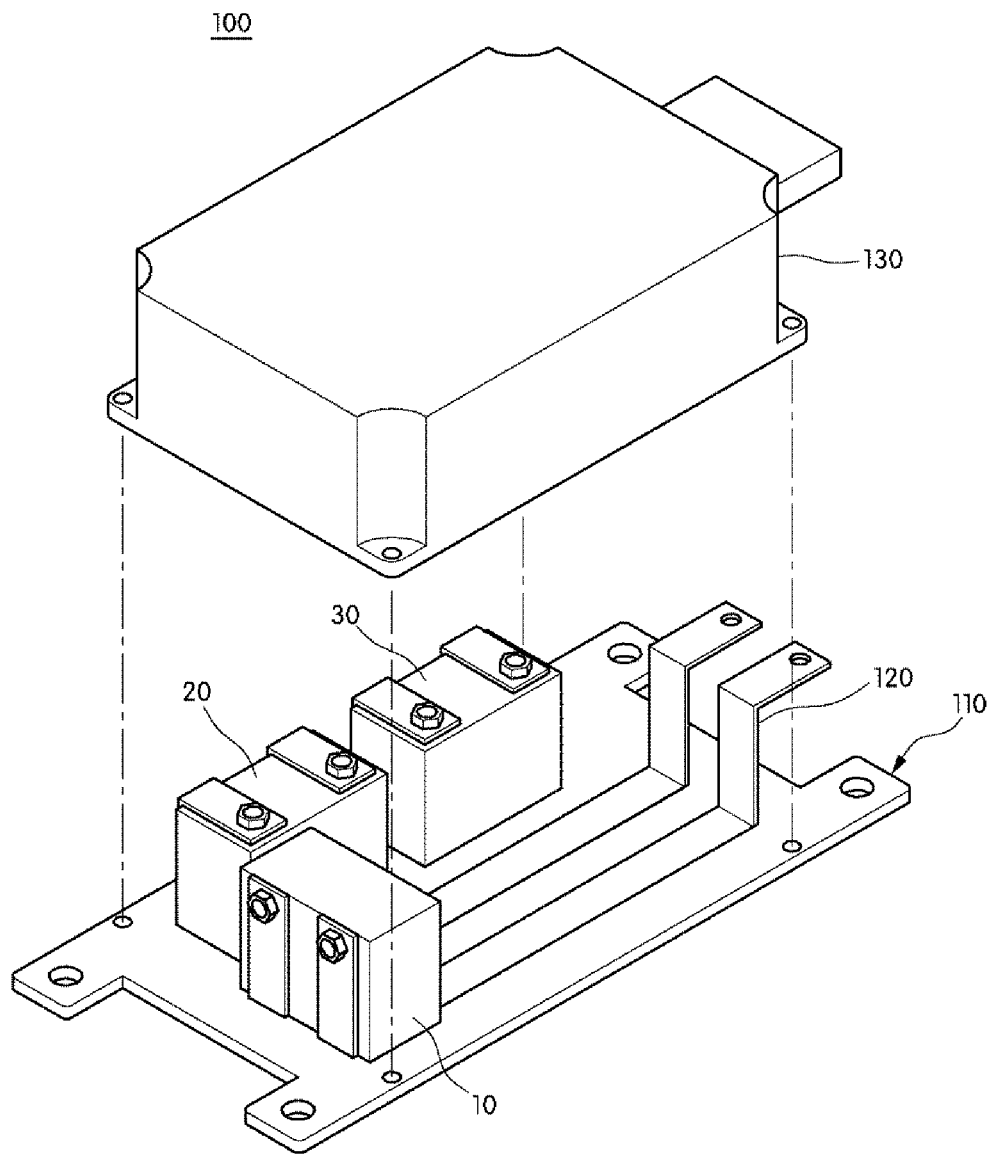
FIG. 1 is a schematic view illustrating a power relay assembly according to one embodiment of the present invention.
Figure 2:
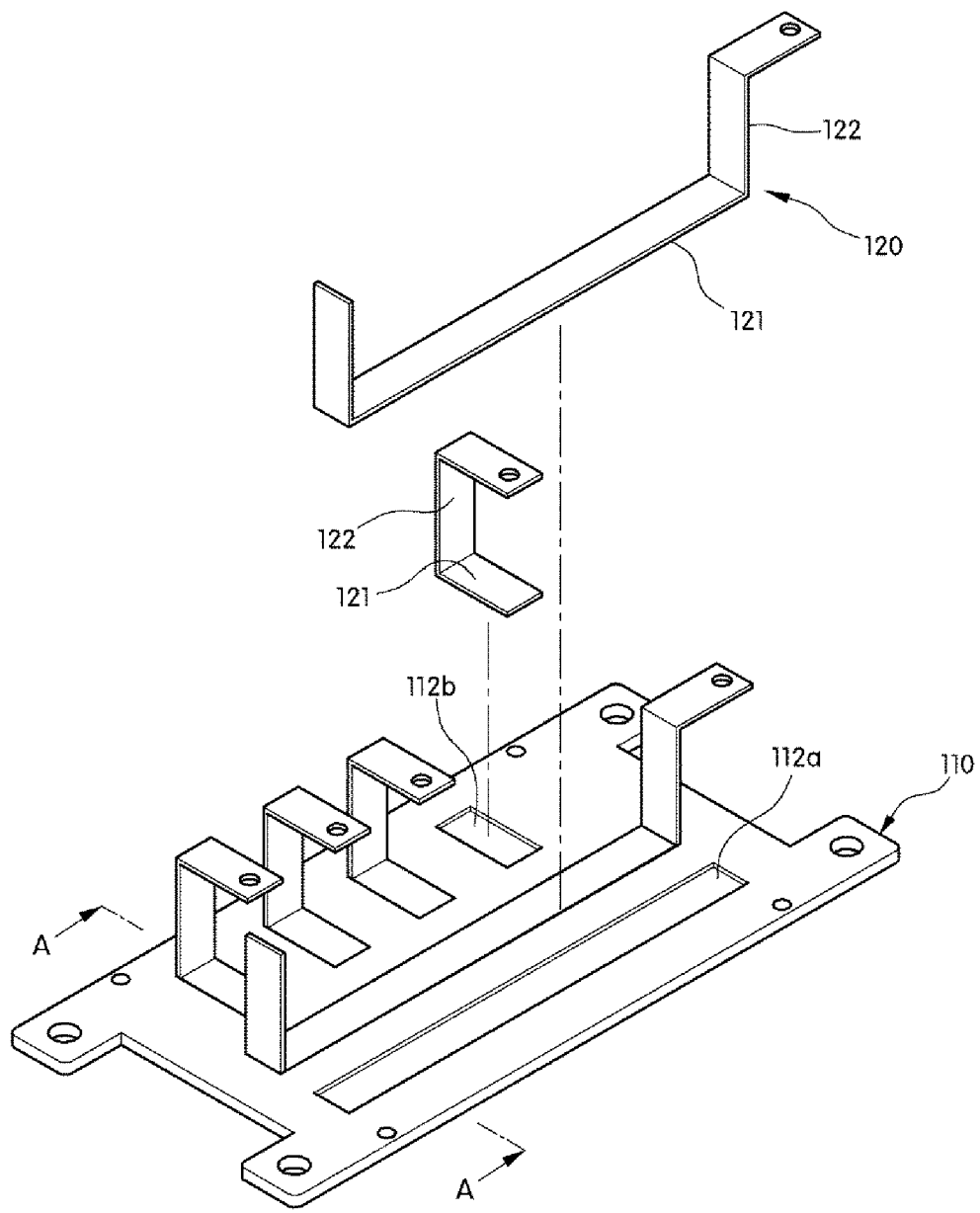
FIG. 2 is a view illustrating a state in which electrical elements are removed in FIG. 1, and is a view illustrating a state in which some bus bars are separated from a support plate.
Figure 3:
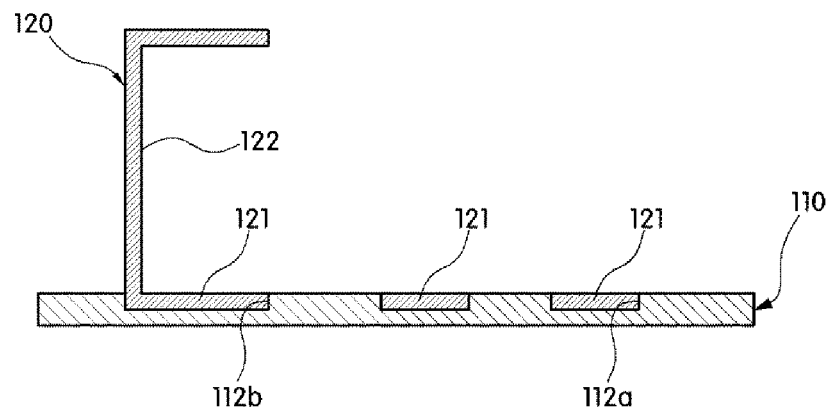
FIG. 3 is a cross-sectional view in direction A-A in FIG. 2.
Figure 4:
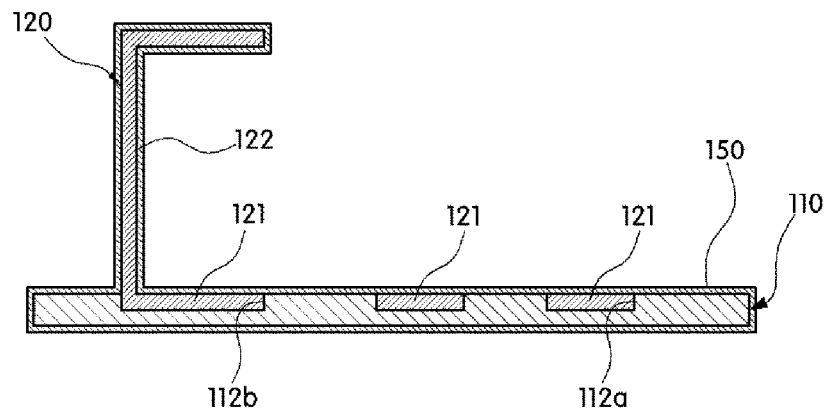
FIG. 4 is a view illustrating a case in which a coating layer is formed on an exposed surface in FIG. 3.

Hereinafter, exemplary embodiments of the present invention will be described in detail with reference to the accompanying drawings which may allow one of ordinary skill in the art to easily carry out the present invention. The present invention may be implemented in various forms and is not limited to the following embodiments. Components not related to the description are not included in the drawings to clearly describe the present invention, and the same reference symbols are used for the same or similar components in the description.

A power relay assembly 100 according to one embodiment of the present invention may supply power to a driving control part configured to block or connect a high-voltage current supplied from a battery to control a driving voltage.

To this end, as shown in FIG. 1, the power relay assembly 100 according to one embodiment of the present invention includes a support plate 110, at least one electrical element 10, 20, or 30, and at least one bus bar 120.

As shown in FIGS. 1 to 13, each of support plates 110, 210, and 310 may have a plate shape having a predetermined area and may support the electrical elements and the bus bars 120 configured to electrically connect the electrical elements.

In this case, the support plate 110, 210, or 310 may have both a heat dissipation property and an insulation property.

Accordingly, in the support plate 110, 210, or 310, a portion having a heat dissipation property may support the electrical elements 10, 20, and 30 and the bus bars 120, and may discharge heat generated when the electrical elements are operated. Further, in the support plate 110, 210, or 310, a portion having an insulation property may prevent an electrical short circuit between the bus bars 120 and the electrical elements 10, 20, and 30.

At least a portion of the above-described support plate 110, 210, or 310 may be formed of a plastic material having a heat dissipation property and an insulation property, and a portion of the bus bar 120 may be fixed to be in surface contact with the portion having a heat dissipation property and an insulation property.

That is, in a case in which a portion of each of the support plates 110, 210, and 310 includes the portion formed of a plastic material having a heat dissipation property and an insulation property, a contact part 121 of the bus bar 120 may be fixed to the support plate 110, 210, or 310 to come into contact with the above-described portion formed of a plastic material having a heat dissipation property and an insulation property.

As a specific example, at least a portion of each of the support plates 110, 210, and 310 may be an injection-molded product formed of a resin-forming composition having a heat dissipation property and an insulation property, and the contact parts 121 of the bus bars 120 may be fixed to one surface of the support plate 110, 210, or 310 to come into contact with the portion formed of the resin-forming composition having a heat dissipation property and an insulation property.

Accordingly, since heat transferred to the support plate 110, 210, or 310 through the contact parts 121 may be quickly dispersed or discharged to the outside, performance degradation and damage due to the heat may be prevented.

Figure 15:
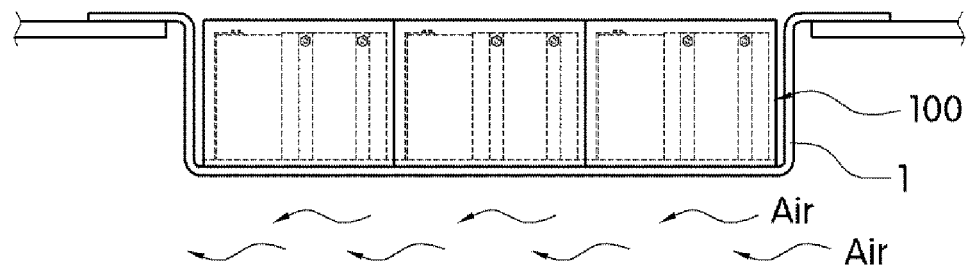
FIG. 15 is a schematic view illustrating a state in which the power relay assembly according to one embodiment of the present invention is mounted in a case of an electric vehicle.
Figure 16:
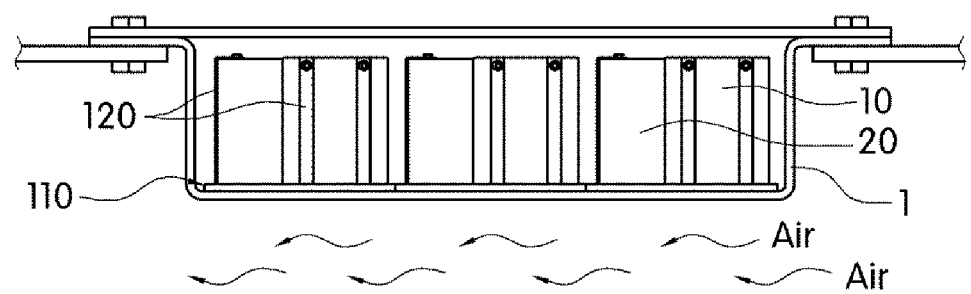
FIG. 16 is a schematic view illustrating a state in which the power relay assembly according to one embodiment of the present invention is mounted in the case of the electric vehicle and sealed by one cover.

As an example, as shown in FIGS. 15 and 16, in a case in which external air comes into contact with a lower side of a case 1 in a natural convection manner or a forced convection manner in a state in which one power relay assembly 100 or a plurality of power relay assemblies 100 according to one embodiment of the present invention are disposed in the box-like case 1, in the power relay assembly 100, since the heat generated from the electrical elements 10, 20, and 30 and/or the bus bars 120 may be transferred to the case 1 through the support plate 110, 210, or 310, the heat generated from the electrical elements 10, 20, and 30 and/or the bus bars 120 may be more efficiently discharged.

However, the support plates 110, 210, and 310 are not limited to the above, and the support plates 110, 210, and 310 may be entirely formed of a plastic material having a heat dissipation property and an insulation property. Preferably, the support plates 110, 210, and 310 may be entirely formed of a plastic material having a heat dissipation property so that an overall heat capacity may increase to improve heat dissipation performance.

Further, each of the support plates 110, 210, and 310 may include the portion formed of a resin-forming composition having a heat dissipation property and an insulation property and a portion formed of a general plastic material having an insulation property.

In addition, as shown in FIGS. 2 to 6, the support plates 110 and 210 may each be one member which is integrally formed. Further, as shown in FIG. 7, the support plate 310 may have a shape in which a plurality of plates 311 and 312 are coupled to each other.

Figure 5:
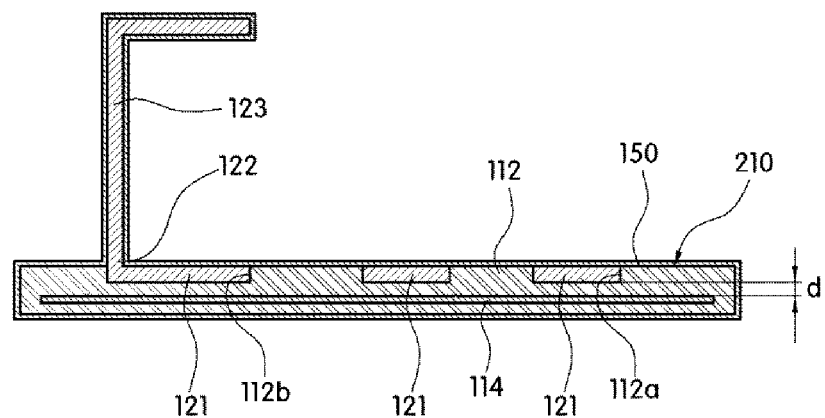
FIGS. 5 and 6 are views illustrating a case in which the support plate applicable to the power relay assembly according to one embodiment of the present invention includes a metal member, and are cross-sectional views viewed from the same direction as that in FIG. 4.
Figure 6:
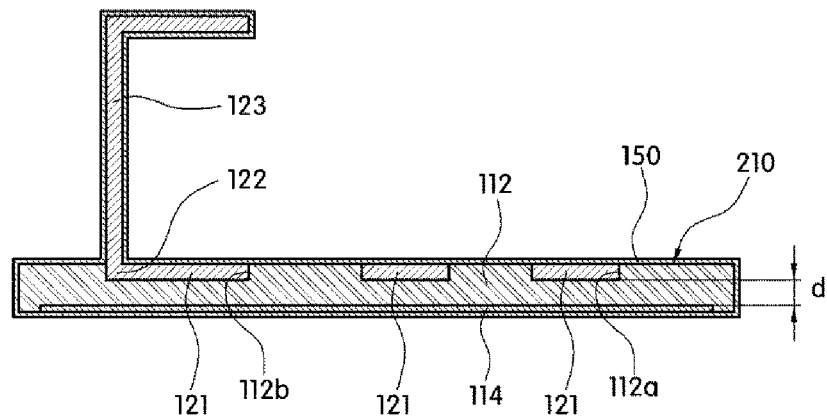
Figure 7:
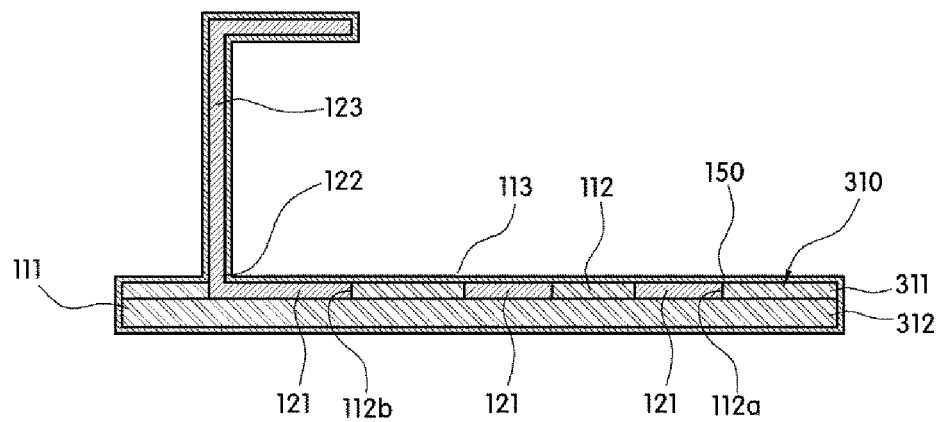
FIG. 7 is a view illustrating a case in which the support plate applicable to the power relay assembly according to one embodiment of the present invention includes a plurality of plates, and is a cross-sectional view viewed from the same direction as that in FIG. 4.

Meanwhile, as shown in FIGS. 5 and 6, the support plate 210 may include a plate-like metal member 114 having a predetermined area to be capable of improving mechanical strength while maintaining heat dissipation performance.

In this case, the metal member 114 may have a shape entirely or partially buried in the support plate 210. Further, the metal member 114 may be buried in the portion of the support plate 210 formed of a plastic material having an insulation property and a heat dissipation property. As an example, the metal member 114 may be integrated with the portion formed of a plastic material having an insulation property and a heat dissipation property through insert injection-molding.

Accordingly, the support plate 210 may realize desired heat dissipation performance while reinforcing mechanical strength through the metal member 114.

Further, since the metal member 114 is buried in the support plate 210 and thus mechanical strength is improved and reinforced, a thickness of the support plate 310 may be reduced.

In addition, in a case in which the support plate 210 includes the metal member 114 which is a conductive member, the support plate 210 may shield electromagnetic waves. Accordingly, the support plate 210 may prevent the influence between components due to noise and a malfunction by shielding the electromagnetic waves generated from the electrical elements.

In the present invention, the metal member 114 may be used without limitation as long as it is made of a metal material having predetermined thermal conductivity. As a non-limiting example, the metal member 114 may be one metal selected from the group consisting of aluminum, magnesium, iron, titanium, and copper or an alloy including at least one of these metals.

As shown in FIG. 5, the metal member 114 may be buried inside the support plate 210 so that its entire surface may be completely surrounded by the portion formed of a plastic material having a heat dissipation property and an insulation property.

Further, as shown in FIG. 6, the metal member 114 may be disposed on one surface of the support plate 210 so that one surface thereof may be exposed to the outside while coming into contact with the portion formed of a plastic material having a heat dissipation property and an insulation property.

In addition, the metal member 114 may be connected to a ground line. In this case, since the electromagnetic waves blocked by the metal member 114 are smoothly emitted through the ground line, an electromagnetic wave shielding effect may be further improved. As an example, the ground line may be a body of a vehicle formed of a metal material.

In this case, after insert injection molding, the metal member 114 may be surface-treated so as not to be separated from an interface with the portion formed of a plastic material having a heat dissipation property and an insulation property. Accordingly, the metal member 114 may increase a bonding force with the portion formed of a plastic material having a heat dissipation property and an insulation property. Alternatively, a nano-sized fine groove (not shown) having a predetermined pattern may be formed in at least one surface of the metal member 114 to improve a bonding force between the metal member 114 and the portion formed of a plastic material having a heat dissipation property and an insulation property.

Meanwhile, in a case in which the support plate 210 includes the metal member 114, the metal member 114 may be spaced a predetermined interval d apart from the contact parts 121 of the bus bars 120 fixed to one surface of the support plate 310. That is, the metal member 114 may maintain the predetermined interval d from each of lower portions of the contact parts 121 of the bus bars 120 and may be partially or entirely buried in the support plate 210.

As a specific example, the metal member 114 and the contact parts 121 of the bus bars 120 may be spaced apart from each other to have an interval d of 1 mm or more, to maintain the insulation property and satisfy a desired withstand voltage property.

In the present invention, as described above, the metal member 114 may be a plate-like metal plate having a predetermined area. However, the metal member 114 is not limited thereto, and may be provided in a bar shape having a predetermined aspect ratio. Further, the metal member 114 may also be a mesh type having a closed loop-shaped edge such as a quadrangular or circular edge and in which a plurality of wires or bars are disposed to be spaced a predetermined interval apart from each other inside the edge. When the metal member 114 is the mesh type, the plurality of wires or bars disposed inside the edge may have any one of a parallel structure, a lattice structure, a honeycomb structure, and various structures in which these structures are combined with each other.

Meanwhile, the plastic having a heat dissipation property and an insulation property used to configure the above-described support plates 110, 210, and 310 may have a shape in which an insulating heat dissipation filler is dispersed in a polymer matrix.

As an example, the polymer matrix may be used without limitation when implemented as a polymer compound which does not hinder the dispersibility of the heat dissipation filler and may be injection-molded. As a specific example, the polymer matrix may be a known thermoplastic polymer compound, and the thermoplastic polymer compound may be a compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI), and polyimide or a mixture or copolymer of at least two among the above group.

Further, the insulating heat dissipation filler may be used without limitation as long as it has both an insulation property and a heat dissipation property. As a specific example, the insulating heat dissipation filler may include at least one selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide, and manganese oxide.

Further, the insulating heat dissipation filler may be porous or nonporous, and may also be a core-shell type filler in which a known conductive heat dissipation filler such as a carbon-based filler, a metal filler, or the like is used as the core and an insulating component surrounds the core.

In addition, in the case of the insulating heat dissipation filler, the surface may be modified with a functional group such as a silane group, an amino group, an amine group, a hydroxyl group, a carboxyl group, or the like to improve an interfacial bonding force with the polymer matrix by improving wettability or the like.

However, the plastic having an insulation property and a heat dissipation property which is usable in the present invention is not limited to the above, and all plastics having both an insulation property and a heat dissipation property may be used without limitation.

The plurality of electrical elements 10, 20, and 30 may be mounted on one surface of each of the support plates 110, 210, or 310 and may be electrically connected to each other through the bus bars 120. Accordingly, the electrical elements 10, 20, and 30 may serve to block or connect the high-voltage current supplied from the battery to the driving control part.

The above-described electrical elements 10, 20, and 30 may be main relays, pre-charge relays, pre-charge resistors, battery current sensors, main fuses, and the like and may be electrically connected to each other through the bus bars 120 or a cable (not shown). Further, the plurality of bus bars 120 may be electrically connected to each other through circuit patterns (not shown) formed on the support plate 110, 210, or 310.

Accordingly, the electrical elements 10, 20, and 30 may supply power to a driving control part (not shown) configured to control a driving voltage by blocking or connecting the high-voltage current supplied from the battery to generate control signals for driving a motor in the driving control part. In this case, the driving control part may generate control signals for driving the motor, and since an inverter and a converter are controlled through the control signals, driving of the motor may be controlled.

As an example, since the main relay is connected and the pre-charge relay is blocked when a vehicle is driven, the power from the battery may be applied to the inverter through a main circuit.

Further, since the main relay is in a blocked state and the connection between the battery and the inverter is blocked when the vehicle is turned off, a battery voltage may be prevented from being transferred to the motor through the inverter. In this case, when the main relay is blocked, a capacitor connected to the inverter may be discharged.

Subsequently, when the vehicle is driven again, since the pre-charge relay is connected and thus the battery voltage is applied to the inverter in a state of being lowered by a pre-charge resistor, charging of the capacitor may be started. In addition, when the capacitor is sufficiently charged, since the main relay is connected and the pre-charge relay is blocked, the battery voltage may be applied to the inverter.

Since the operation of the above-described electrical elements is publically known, detailed descriptions thereof will not be provided.

The bus bars 120 may electrically connect the plurality of electrical elements mounted on the support plate 110, 210, or 310.

To this end, the bus bar 120 may be formed of a conductor having low impedance and large current capacity, and may serve to separately connect at least two electrical elements or connect several equivalent points to distribute power to various positions.

The above-described bus bar 120 may be provided in a plate-like bar shape having a predetermined length. Further, the bus bar 120 may have a shape in which a portion of the entire length is bent once or multiple times to be easily fastened to the electrical elements 10, 20, and 30. However, an overall shape of the bus bar 120 is not limited to the above and may be appropriately changed according to arrangement locations of the electrical elements 10, 20, and 30 that are desired to be connected to each other.

In this case, as described above, at least a portion of the bus bar 120 may be fixed to come into contact with one surface of the above-described support plate 110, 210, or 310, and may directly come into contact with the portion of the support plate 110, 210, or 310 formed of a plastic material having a heat dissipation property and an insulation property. Accordingly, the heat generated when the electrical elements are operated may be dispersed or discharged to the outside after being transferred to the support plate 110, 210, or 310.

As an example, the bus bar 120 may include the contact part 121 configured to directly come into contact with one surface of the support plates 110, 210, or 310, and the contact part 121 may be fixed to directly come into contact with the portion of the support plate 110, 210, or 310 formed of a plastic material having a heat dissipation property and an insulation property.

Accordingly, in the bus bar 120, since the contact part 121 is disposed to come into contact with the support plate 110, 210, or 310 formed of a plastic material having a heat dissipation property and an insulation property, heat generated when the electrical elements and the bus bars 120 are operated may be smoothly transferred to the portions formed of a plastic material having a heat dissipation property. Accordingly, the power relay assembly 100 according to one embodiment of the present invention may prevent performance degradation and damage due to the heat.

Further, the bus bar 120 may include an extending part 122 configured to extend from the contact part 121 by a predetermined length, and the extending part 122 may be a portion configured to extend from at least one end portion of both end portions of the contact part 121 and protrude toward the outside of each of the support plate 110, 210, or 310. Accordingly, the plurality of electrical elements 10, 20, and 30 may be electrically connected to each other through the extending part 122.

However, the bus bar 120 is not limited thereto, and the bus bar 120 may include only the contact part 121 configured to directly come into contact with the support plate 110, 210, or 310.

A plurality of bus bars 120 may be provided. In addition, at least some of the plurality of bus bars 120 may be respectively connected to plus or minus terminals of the battery and plus and minus terminals of an inverter. Accordingly, the electrical elements 10, 20, and 30 may block or connect the high-voltage current supplied from the battery to the driving control part.

Meanwhile, the bus bars 120 may be fixed to one surface of the support plate 110, 210, or 310 in various ways.

As an example, as shown in FIGS. 1 to 7, since the contact parts 121 are inserted into one surface of the support plate 110, 210, or 310, the bus bars 120 may be fixed to one surface of the support plate 110, 210, or 310.

To this end, each of the support plates 110, 210, and 310 may have at least one accommodation groove 112a or 112b recessed inward in one surface thereof. Accordingly, since the contact parts 121 are inserted into the accommodation grooves 112a and 112b, the bus bars 120 may be fixed to one surface of the support plate 110, 210, or 310, and may come into surface contact with the support plate 110, 210, or 310 through the contact part 121.

In this case, the accommodation grooves 112a and 112b may have shapes corresponding to the contact parts 121, and the shapes of the accommodation grooves 112a and 112b may be appropriately changed according to the shapes of the bus bars 120. As a result, the heat generated when the electrical elements and the bus bars 120 are operated may be transferred to the support plates 110, 210, and 310 having a heat dissipation property to be dispersed or discharged to the outside.

In this case, depths of the accommodation grooves 112a and 112b may be formed to be the same as the thicknesses of the contact parts 121, and an adhesive member (not shown) or a heat transferring material may be interposed between one surface of the contact part 121 and a bottom surface of the accommodation groove 112a or 112b that face each other.

Here, the adhesive member may be a general adhesive member providing cohesion or adhesion, but may also be a heat dissipation adhesive member including a thermally conductive filler. Accordingly, the heat transferring material or the heat dissipation adhesive member may easily transfer the heat present in the bus bars 120 to the support plates 110, 210, and 310 having a heat dissipation property.

Although the drawings illustrate that the accommodation grooves 112a and 112b are recessed inward from one surface of the support plate 110, the present invention is not limited to the above, and the accommodation grooves 112a and 112b may be formed through a hollow protruding part (not shown) configured to protrude from one surface of the support plate 110, 210, or 310. In this case, the protruding part may be formed to partially or entirely surround an edge of the contact part 121.

As another example, as shown in FIGS. 8 to 13, since the contact parts 121 are fixed through separate fixing members 140, 240, or 340, the bus bars 120 may be fixed to one surface of the support plate 110.

That is, in the support plate 110, at least one fixing member 140, 240, or 340 may be provided at regions corresponding to the contact parts 121, and the contact parts 121 may be fixed through the fixing member 140, 240, or 340.

As a specific example, as shown in FIGS. 8 to 11, the fixing members 140 and 240 may be clip members which are elastically deformed, and the clip member may have one end portion that comes into contact with an upper surface of the contact part 121.

Accordingly, since the contact part 121 maintains a state in which the one surface thereof comes into contact with the support plate 110 through the fixing member 140 or 240, the bus bar 120 may be prevented from separating from the support plate 110.

Figure 8:
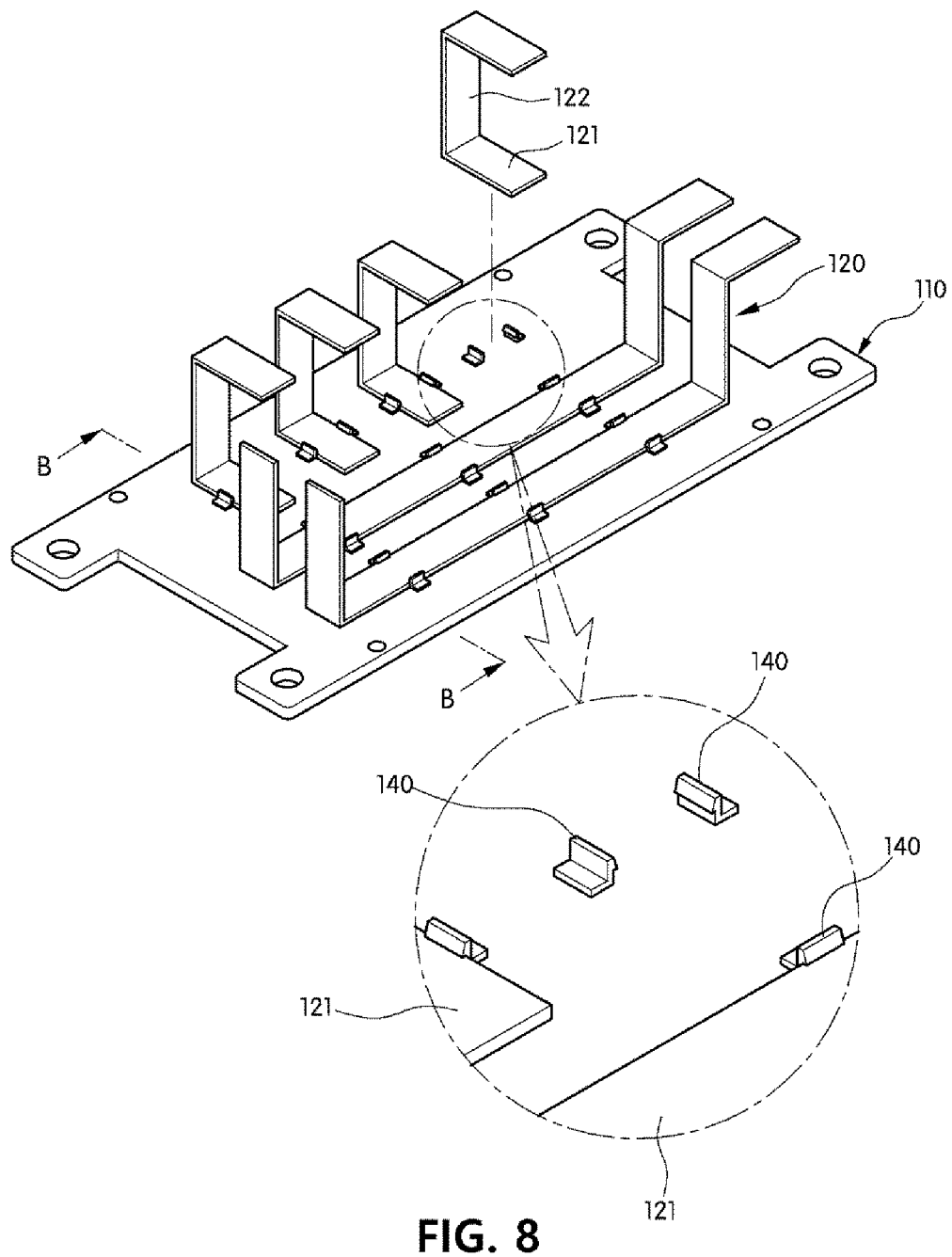
FIG. 8 is a schematic view illustrating a power relay assembly according to another embodiment of the present invention, and is a view illustrating a state in which electrical elements are removed.
Figure 9:
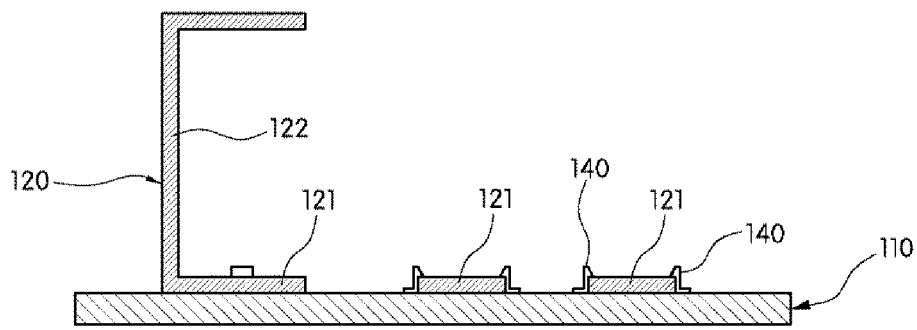
FIG. 9 is a cross-sectional view in direction B-B in FIG. 8.

Specifically, as shown in FIGS. 8 and 9, the clip member may be disposed at the edge of the contact part 121, and may include a portion configured to protrude in a direction parallel to the upper surface of the contact part 121. Accordingly, in the clip member, the protruding portion may support a side end and/or a front end of the contact part 121.

Figure 10:
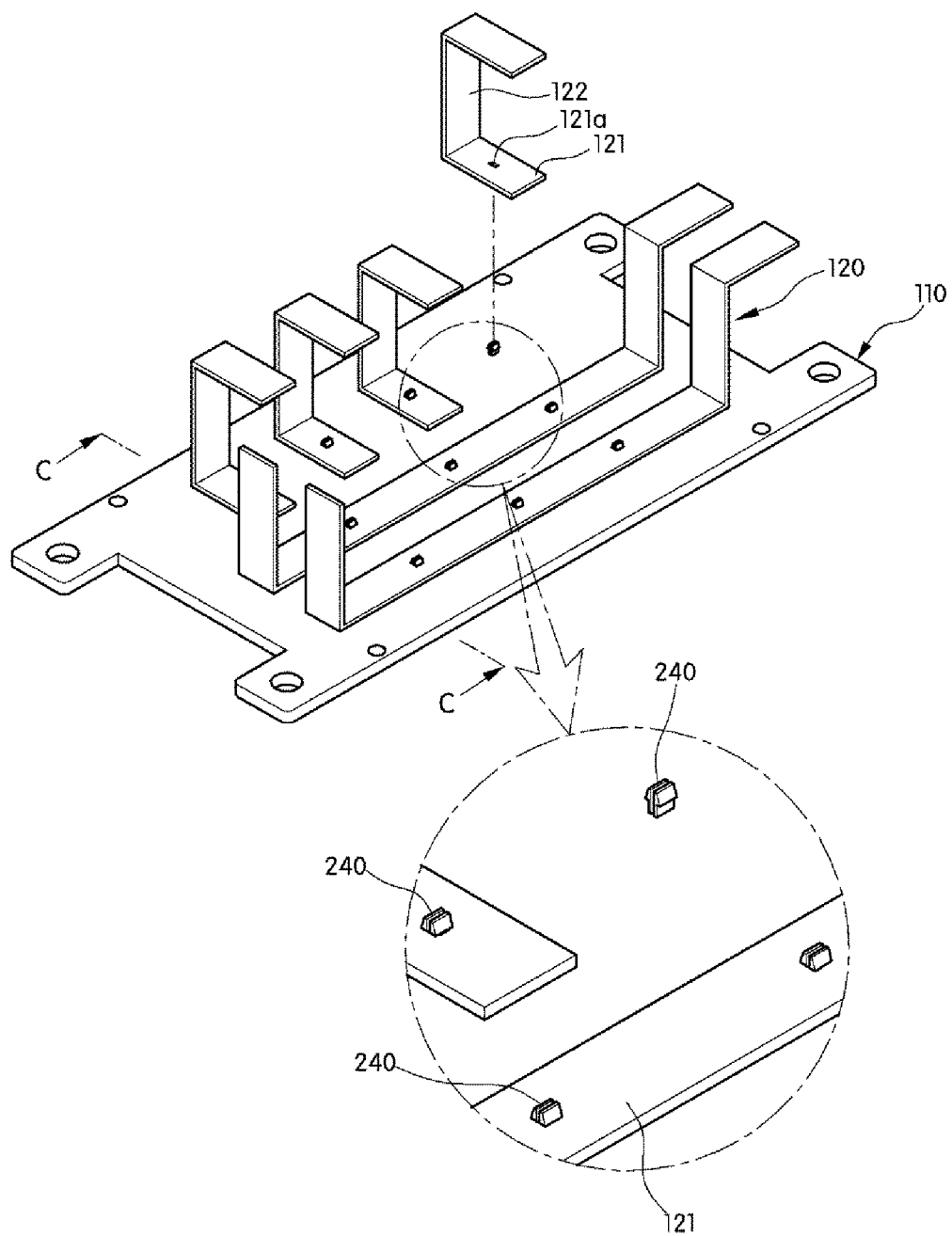
FIG. 10 is a schematic view illustrating a power relay assembly according to still another embodiment of the present invention, and is a view illustrating a state in which electrical elements are removed.
Figure 11:
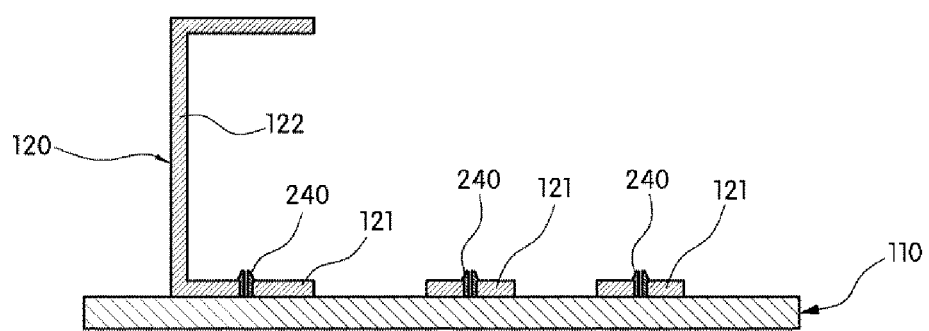
FIG. 11 is a cross-sectional view in direction C-C in FIG. 10.

Alternatively, as shown in FIGS. 10 and 11, the clip member may be formed of a pair of members disposed to be spaced an interval apart from each other, and the clip member may have a shape of which one end portion is fixed to the support plate 110. In this case, each of the pair of members may include a portion configured to protrude in a direction parallel to the upper surface of the contact part 121, and a through hole 121a may be formed through the contact part 121 at a position corresponding to the clip member.

Accordingly, in a case in which the contact part 121 is disposed to come into contact with one surface of the support plate 110, the pair of members may pass through the through hole 121a of the contact part 121 through elastic deformation, and the protruding portions may support edges of the through hole 121a.

Figure 12:
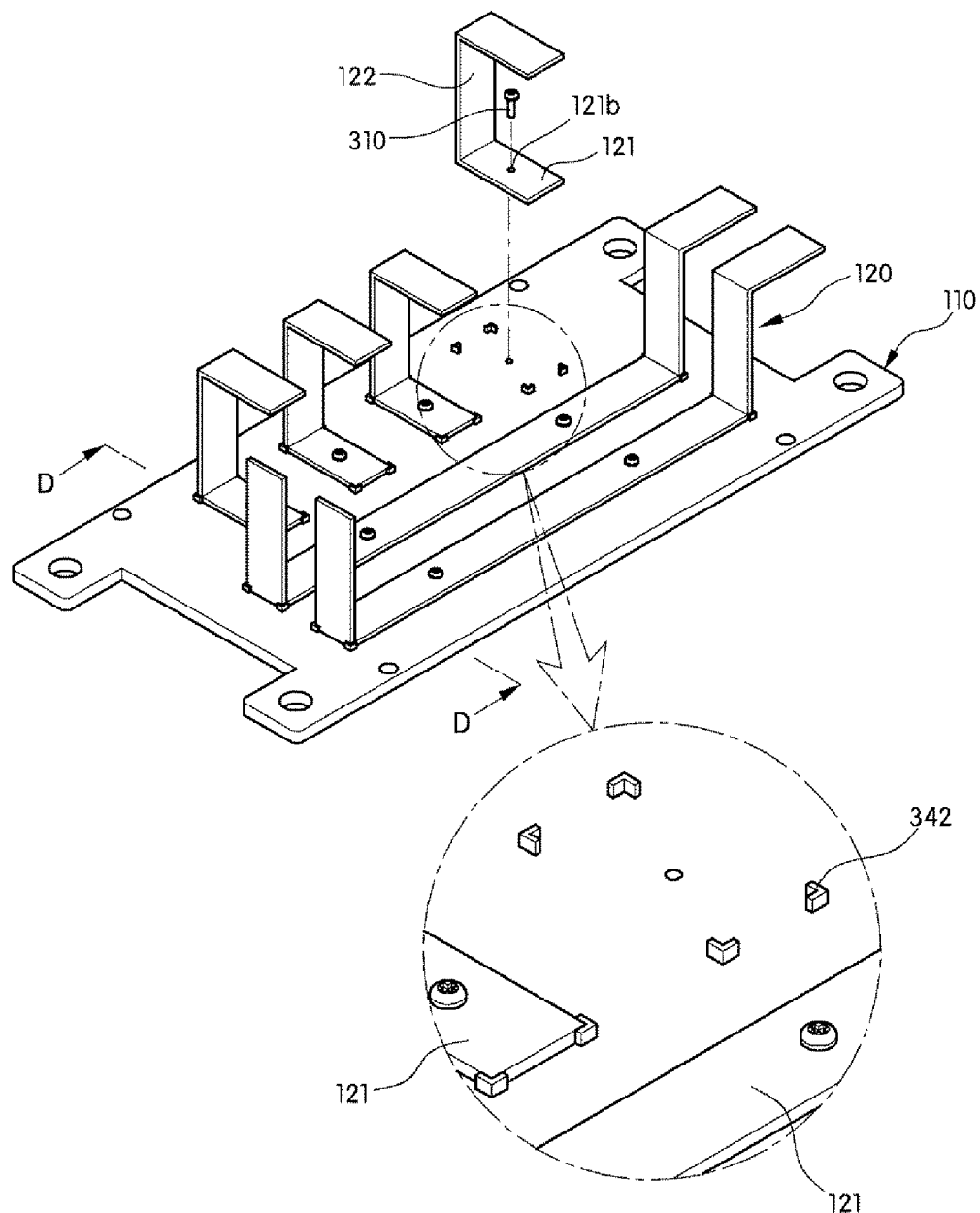
FIG. 12 is a schematic view illustrating a power relay assembly according to yet another embodiment of the present invention, and is a view illustrating a state in which electrical elements are removed.
Figure 13:
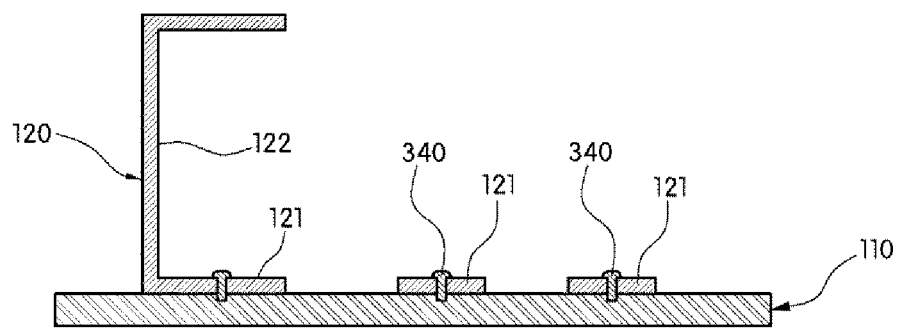
FIG. 13 is a cross-sectional view in direction D-D in FIG. 12.

As another example, as shown in FIGS. 12 and 13, the fixing members 340 may be known bolt members. In this case, a fastening hole 121b may be formed through the contact part 121. Accordingly, in a case in which the contact parts 121 and the support plate 110 are fastened to each other by the bolt members, the bus bars 120 may be fixed to one surface of the support plate 110. Here, guide members 342 formed to protrude to guide positions of the contact parts 121 may be formed on one surface of the support plate 110.

However, the fixing member is not limited to the above, and a known pin member may be used as the fixing member, and the fixing member may have a form in which the fixing members shown in FIGS. 8 to 13 are combined. Further, the support plate 210 or 310 shown in FIGS. 5 to 7 may be applied as the support plate 110 shown in FIGS. 8 to 13.

Meanwhile, the power relay assembly 100 according to the present invention may further include a protective coating layer 150.

As an example, as shown in FIGS. 4 to 7, the protective coating layer 150 may be provided to cover all outer surfaces of the support plate 110, 210, or 310 and the bus bars 120. Further, the protective coating layer 150 may also cover all outer surfaces of the electrical elements 10, 20, and 30 mounted on one surface of the support plate 110, 210, or 310. However, an application location of the protective coating layer 150 is not limited thereto, and the protective coating layer 150 may be applied on only the outer surfaces of the support plate 110, 210, or 310 or applied on only the outer surfaces of the bus bars 120. Further, the protective coating layer 150 may be identically applied to the support plate 110 shown in FIGS. 8 to 13.

The above-described protective coating layer 150 may prevent scratches due to physical stimuli applied to the surfaces of the support plate 110, 210, or 310 and the bus bars 120 and further improve an insulation property of the surfaces.

Further, in a case in which the support plates 110, 210, and 310 are formed of plastic in which the insulating heat dissipation filler is dispersed, the protective coating layer 150 may serve to prevent separation of the insulating heat dissipation filler located at the surfaces of the protective coating layer 150.

As an example, the protective coating layer 150 may be implemented with a known thermosetting polymer compound or thermoplastic polymer compound. The thermosetting polymer compound may be a compound selected from the group consisting of an epoxy-based resin, a urethane-based resin, an ester-based resin, and a polyimide-based resin, or a mixture or copolymer of at least two among the above group. Further, the thermoplastic polymer compound may be a compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI), and polyimide or a mixture or copolymer of at least two among the above group, but is not limited thereto.

Meanwhile, since the protective coating layer 150 may be applied on the outer surfaces of the support plates 110, 210, and 310, heat transferred to the support plate 110, 210, and 310 may be prevented from being discharged to the outside. To this end, the protective coating layer 150 may further include an insulating heat dissipation filler to improve the characteristic of dissipating heat to the outside. The insulating heat dissipation filler may be used without limitation in the case of known insulating heat dissipation fillers.

As an example, the protective coating layer 150 may include an insulating heat dissipation filler dispersed in a polymer matrix to have both a heat dissipation property and an insulation property like the above-described support plates 110, 210, and 310.

In this case, as the insulating heat dissipation filler included in the protective coating layer 150, the same type as or different type from the insulating heat dissipation filler included in the support plate 110, 210, or 310 may be used.

As described above, the bus bar 120 may be formed of a conductor having low impedance and large current capacity. As a specific example, the bus bars 120 may be formed of a metal material such as copper or aluminum.

Here, in a case in which the bus bars 120 are formed of an aluminum material, as shown in FIG. 13, each of the bus bars 120 may have a form in which a heat dissipation coating layer C is formed on surfaces thereof and the heat dissipation coating layer C may be the same as a protective coating layer 150 including the above-described insulating heat dissipation filler. That is, the bus bar 120 formed of an aluminum material may have a lighter weight than the bus bar 120 formed of a copper material because aluminum has a lower specific gravity than copper, due to the characteristics of the materials. Accordingly, the power relay assembly in which aluminum is used for the material of the bus bars 120 may have a much lighter weight than the power relay assembly in which copper is used for the material of the bus bars 120.

On the other hand, since aluminum has a lower heat conductivity than copper, due to the characteristics of the materials, when both are manufactured in the same size, the bus bar made of aluminum may have inferior heat dissipation performance and should be made thick to realize heat dissipation performance similar to that of the bus bar made of copper.

In the present invention, to solve this problem, when the bus bars 120 are formed of an aluminum material, the heat dissipation coating layer C including the insulating heat dissipation filler is formed on the surface of the bus bar 120 to supplement the heat dissipation performance, and thus heat dissipation performance similar to that of the bus bar formed of a copper material may be realized even when the thickness minimally increases compared to when the bus bars are formed of a copper material.

Accordingly, the power relay assembly in which aluminum is used for the material of the bus bars 120 may be lightened compared to the power relay assembly in which copper is used for the material of the bus bars 120, and manufacturing costs may be reduced.

As a non-limiting example, the bus bar formed of an aluminum material should have a thickness about 1.5 times that of the bus bar formed of a copper material having the same shape to realize similar heat dissipation performance. However, when the heat dissipation coating layer C including the insulating heat dissipation filler is formed on the surface of the bus bar, the bus bar formed of an aluminum material and having the heat dissipation coating layer C including the insulating heat dissipation filler formed on the surface thereof may realize heat dissipation performance similar to that of the bus bar formed of a copper material even when having a thickness 1.3 times that of the bus bar formed of a copper material.

However, the material used for the bus bar 120 is not limited thereto and any conductor having low impedance and large current capacity may be used without limitation.

Meanwhile, as shown in FIG. 1, the power relay assembly 100 according to one embodiment of the present invention may include at least one cover 130 configured to cover and protect the electrical elements 10, 20, and 30 and the bus bars 120.

That is, the cover 130 may protect the electrical elements 10, 20, and 30 and the bus bars 120 from an external environment by preventing the electrical elements 10, 20, and 30 and the bus bars 120 mounted on one surface of the support plate 110, 210, or 310 from being exposed to the outside.

The above-described cover 130 may be directly fastened to the support plate 110, 210, or 310 and may also be fastened to brackets (not shown) separately provided on an edge of the support plate 110, 210, or 310.

Further, the cover 130 may have a box shape in which one side is open. However, the cover 130 is not limited thereto, and the cover 130 may be formed of one member, and a plurality of components may also be assembled together to configure one box.

Figure 14:
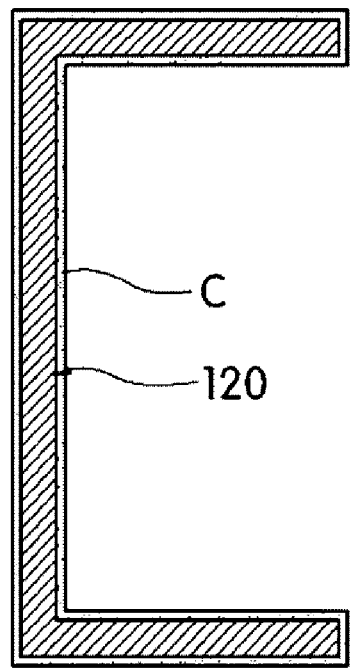
FIG. 14 a cross-sectional view illustrating the bus bars applicable to the power relay assembly according to one embodiment of the present invention, and is a view illustrating a case in which the coating layer is formed on a surface.

Further, as shown in FIGS. 1 and 14, the cover 130 may a shape which covers one support plate 110, 210, or 310, or as shown in FIG. 15, the cover 130 may have a shape which simultaneously covers a plurality of support plates 110, 210, and 310 disposed adjacent to each other using one cover 130.

In addition, the cover 130 may be formed of a general plastic material having an insulation property but at least a part of the cover 130 may be formed of a plastic material having a heat dissipation property and an insulation property like the above-described support plate 110, 210, or 310.

Although embodiments of the present invention are described above, the spirit of the present invention is not limited to the embodiments shown in the description, and although those skilled in the art may provide other embodiments through the addition, change, or removal of the components within the scope of the same spirit of the present invention, such embodiments are also included in the scope of the spirit of the present invention.

The invention claimed is:

1. A power relay assembly comprising:
   a support plate having at least one electrical element mounted on one surface thereof and including a plastic material having a heat dissipation property and an insulation property; and
   at least one bus bar electrically connected to the electrical element and including a contact part directly in surface contact with one surface of the support plate, wherein the contact part of the bus bar is fixed to the one surface of the support plate, wherein the support plate further includes a plate-like metal member disposed to be spaced an interval apart from the contact part.

2. The power relay assembly of claim 1, wherein the contact part is in surface contact with a portion of the support plate formed of a plastic material having a heat dissipation property and an insulation property.

3. The power relay assembly of claim 1, wherein the bus bar further includes an extending part configured to extend from at least any one end portion of both end portions of the contact part.

4. The power relay assembly of claim 1, wherein
   the support plate includes an accommodation groove recessed inward in a region corresponding to the contact part; and
   the contact part is disposed to be inserted into the accommodation groove.

5. The power relay assembly of claim 4, wherein the accommodation groove is formed to have a depth the same as a thickness of the contact part.

6. The power relay assembly of claim 4, further comprising any one of an adhesive member and a heat transferring material interposed between a bottom surface of the accommodation groove and the contact part.

7. The power relay assembly of claim 1, wherein the contact part is fixed to the one surface of the support plate through a fixing member.

8. The power relay assembly of claim 7, wherein the fixing member is any one of a clip member, a pin member, and a bolt member.

9. The power relay assembly of claim 1, wherein the metal member is buried inside the support plate.

10. The power relay assembly of claim 1, wherein the metal member is fixed to the one surface of the support plate so that one surface thereof is exposed to the outside.

11. The power relay assembly of claim 1, wherein the metal member is disposed on the support plate to be spaced 1 mm or more apart from the contact part.

12. The power relay assembly of claim 1, wherein a coating layer having an insulation property and a heat dissipation property is formed on an exposed surface of the power relay assembly.

13. The power relay assembly of claim 1, wherein the bus bar is formed of an aluminum material, and has a coating layer having an insulation property and a heat dissipation property on a surface thereof.

14. The power relay assembly of claim 1, comprising at least one cover to prevent exposure of the bus bar to the outside, wherein at least a part of the cover is formed of a plastic material having a heat dissipation property and an insulation property.

* * * * *